(12) United States Patent
Ko et al.

(10) Patent No.: US 8,482,133 B2
(45) Date of Patent: Jul. 9, 2013

(54) SEMICONDUCTOR PACKAGE

(75) Inventors: Jun-young Ko, Cheonan-si (KR); Jae-yong Park, Cheonan-si (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 62 days.

(21) Appl. No.: 13/189,157

(22) Filed: Jul. 22, 2011

(65) Prior Publication Data
US 2012/0049365 A1    Mar. 1, 2012

(30) Foreign Application Priority Data

Aug. 25, 2010 (KR) .................. 10-2010-0082586

(51) Int. Cl.
*H01L 25/065* (2006.01)
*H01L 23/485* (2006.01)

(52) U.S. Cl.
USPC ........... 257/777; 257/686; 257/738; 257/784; 257/E23.021; 257/E25.006; 257/E25.013

(58) Field of Classification Search
USPC ............... 257/686, 777, 738, 784, E23.021, 257/E25.013, E25.006
See application file for complete search history.

(56) References Cited

U.S. PATENT DOCUMENTS

| 6,798,049 | B1 | 9/2004 | Shin et al. |
| 2005/0218518 | A1* | 10/2005 | Jiang et al. ............... 257/738 |
| 2007/0059918 | A1 | 3/2007 | Jung et al. |
| 2010/0117217 | A1 | 5/2010 | Park et al. |
| 2010/0123235 | A1* | 5/2010 | Kim et al. ............... 257/686 |

FOREIGN PATENT DOCUMENTS

| JP | 08-148825 A | 6/1996 |
| JP | 2001-077301 A | 3/2001 |
| JP | 2007-081408 A | 3/2007 |
| KR | 10-0400826 B1 | 3/2001 |
| KR | 10-0661297 B1 | 12/2006 |

* cited by examiner

*Primary Examiner* — Peniel M Gumedzoe
(74) *Attorney, Agent, or Firm* — Muir Patent Consulting, PLLC

(57) ABSTRACT

A semiconductor package is provided. The semiconductor package includes a package substrate, a plurality of semiconductor chips, and a plurality of connection terminals. The package substrate includes a center portion, which has a first recess with a portion of a top of the package substrate removed, and an edge portion that has a plurality of second recesses. Each second recess has a portion of a bottom of the package substrate removed. The plurality of semiconductor chips are mounted in the first recess, and the plurality of connection terminals are respectively disposed in the second recesses.

15 Claims, 11 Drawing Sheets

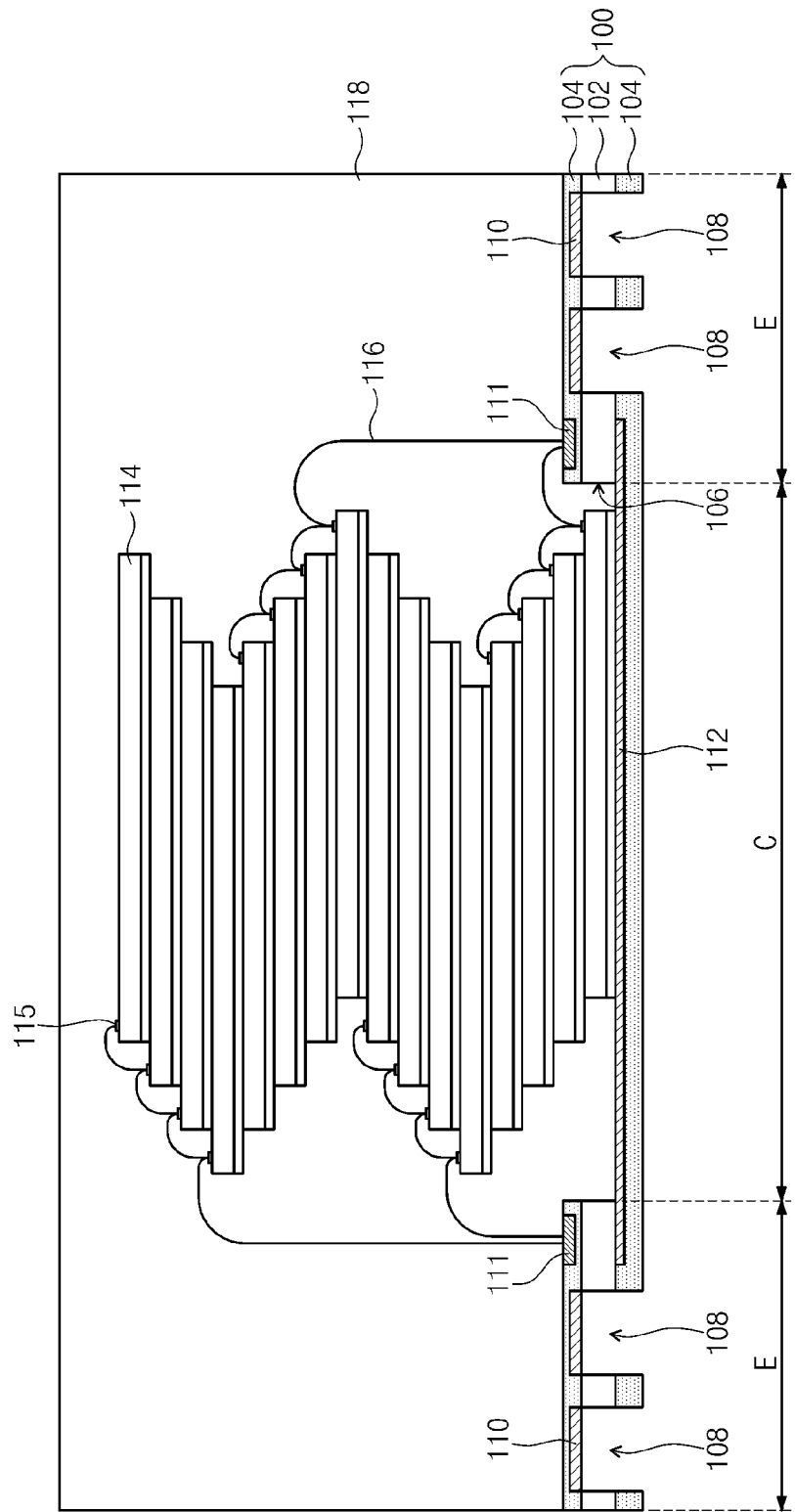

SEMICONDUCTOR PACKAGE

CROSS-REFERENCE TO RELATED APPLICATIONS

This U.S. non-provisional patent application claims priority under 35 U.S.C. §119 to Korean Patent Application No. 10-2010-0082586, filed on Aug. 25, 2010, the entire contents of which are hereby incorporated by reference.

BACKGROUND

The present disclosure relates to a semiconductor package, and more particularly, to a Ball Grid Array (BGA) semiconductor package.

A Ball Grid Array (BGA) may be used as a type of structure for connecting an external terminal to a Printed Circuit Board (PCB) on which semiconductor chips are mounted. Certain factors can cause the total height of the BGA semiconductor package to vary. Some of these factors include, for example, the stacked height of semiconductor chips of the package, the thickness of the PCB, the size of one or more solder ball serving as an external terminal, and the thickness of an encapsulant. Due to advancing semiconductor chip technology, even though the number of stacked semiconductor chips is increasing, the total thicknesses of semiconductor packages is decreasing. However, reducing the thicknesses of the semiconductor chips will eventually reach an uppermost limit. Therefore, research for decreasing the total thickness of semiconductor packages using other methods is continuously being conducted.

SUMMARY

The present disclosure provides a semiconductor package that is reduced in total thickness.

In one embodiment, a semiconductor package includes a package substrate, a plurality of semiconductor chips, and a plurality of connection terminals. The package substrate includes a center portion, which has a first recess with a portion of a top of the package substrate removed, and an edge portion that has a plurality of second recesses. Each second recess has a portion of a bottom of the package substrate removed. The plurality of semiconductor chips are mounted in the first recess, and the plurality of connection terminals are respectively disposed in the second recesses.

In another embodiment, a semiconductor package includes a package substrate, a stack of semiconductor chips, and a plurality of connection terminals. The package substrate includes a first recess extending from a top surface of the package substrate toward a bottom of the package substrate, and a plurality of second recesses extending from a bottom surface of the package substrate toward a top of the package substrate. The stack of semiconductor chips is disposed at and extends above the second recess. The plurality of connection terminals are respectively disposed in the plurality of second recesses, In another embodiment, a stacked semiconductor chip package is disclosed. The stacked semiconductor chip package includes a package substrate, a semiconductor chip stack, and a plurality of connection terminals. The package substrate includes a first recess having a first depth and a plurality of second recesses each having a second depth, wherein the first recess is disposed at a first surface of the substrate, and the second recess is disposed at a second, opposite surface of the substrate. The semiconductor chip stack is disposed at the first recess and includes a plurality of semiconductor chips. The plurality of connection terminals are disposed in respective of the plurality of second recesses, wherein the first recess extends more than half of the distance into the package substrate from the first surface of the substrate, and the plurality of second recesses extend more than half of the distance into the package substrate from the second surface of the substrate.

BRIEF DESCRIPTION OF THE DRAWINGS

The accompanying drawings are included to provide a further understanding of the disclosed embodiments, and are incorporated in and constitute a part of this specification. The drawings illustrate exemplary embodiments and, together with the description, serve to explain principles of the present disclosure. In the drawings:

FIGS. 2A to 2E are cross-sectional views illustrating a method of manufacturing a semiconductor package according to an exemplary embodiment;

DETAILED DESCRIPTION OF THE EMBODIMENTS

Figure 1A:
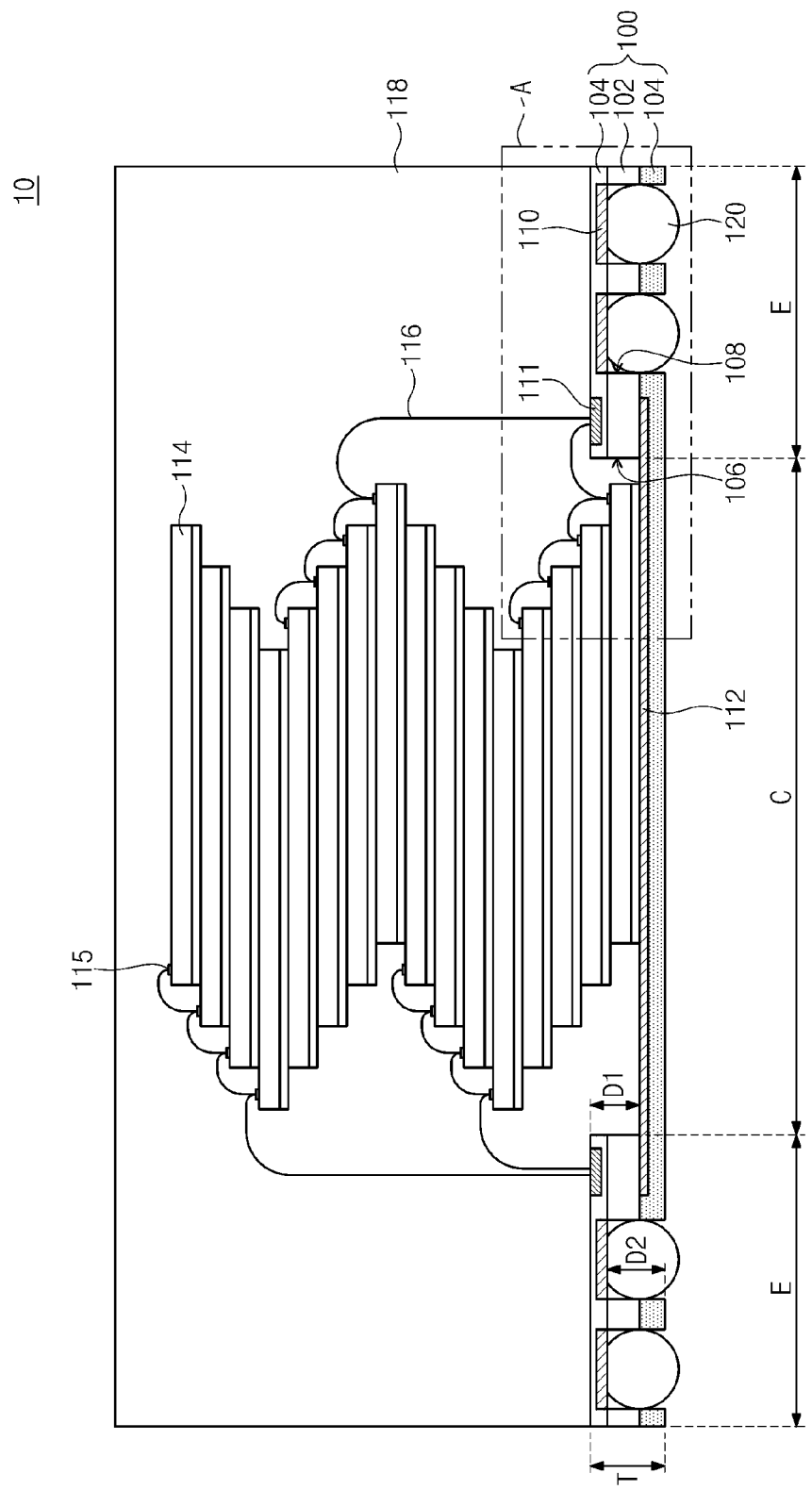
FIG. 1A is a cross-sectional view illustrating a semiconductor package according to an exemplary embodiment.

Exemplary embodiments will be described below in more detail with reference to the accompanying drawings. The inventive concept may, however, be embodied in different forms and should not be construed as limited to the embodiments set forth herein.

As used herein, the term "and/or" includes any and all combinations of one or more of the associated listed items.

In the specification, it will be understood that when an element is referred to as being 'on' another element, it can be directly on the other element, or intervening elements may also be present. Like reference numerals refer to like elements throughout.

Additionally, the embodiments in the detailed description will be described with sectional views as ideal exemplary views. In the figures, the dimensions of layers and regions are exaggerated for clarity of illustration. Accordingly, shapes of the exemplary views may be modified according to manufacturing techniques and/or allowable errors. Therefore, the embodiments disclosed herein are not limited to the specific shape illustrated in the exemplary views, but may include other shapes that may be created according to manufacturing processes.

Also, though terms like a first, a second, and a third are used to describe various elements, regions, and layers in various embodiments, the elements, regions, and the layers are not limited to these terms. Unless indicated as otherwise, these terms are used only to discriminate one element, region, or layer from another element, region, or layer.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Terms such as "same," "planar," or "coplanar," as used herein when referring to orientation, location, shapes, sizes, amounts, or other measures do not necessarily mean an exactly identical orientation, location, shape, size, amount, or other measure, but are intended to encompass nearly identical orientation, location, shapes, sizes, amounts, or other measures within acceptable variations that may occur, for example, due to manufacturing processes.

In the following description, the technical terms are used only to explain a specific exemplary embodiment while not limiting the present invention. The terms of a singular form may include plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components.

(Semiconductor Package)

Figure 1B:
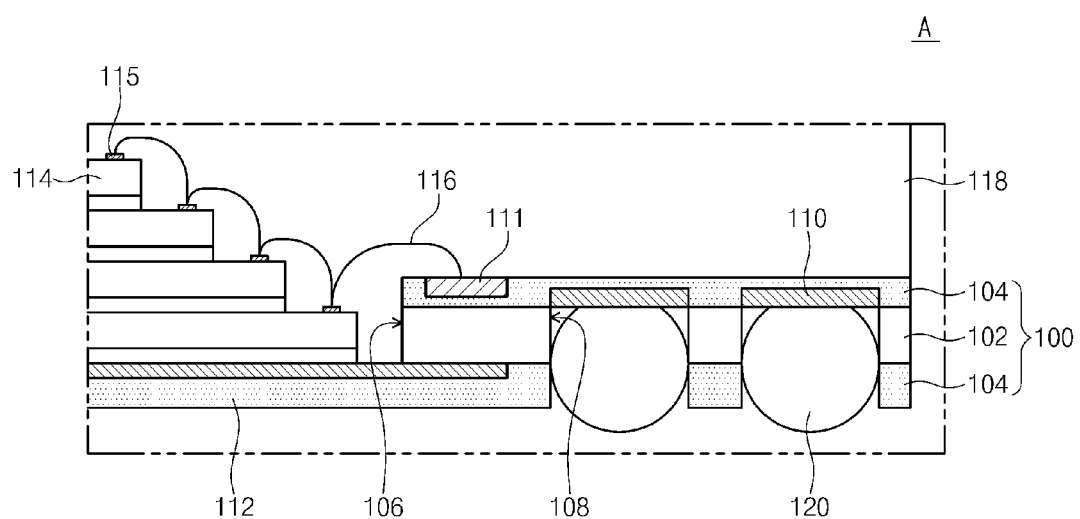
FIG. 1B is an enlarged view of a portion A of the semiconductor package in FIG. 1A, according to an exemplary embodiment.
Figure 1C:
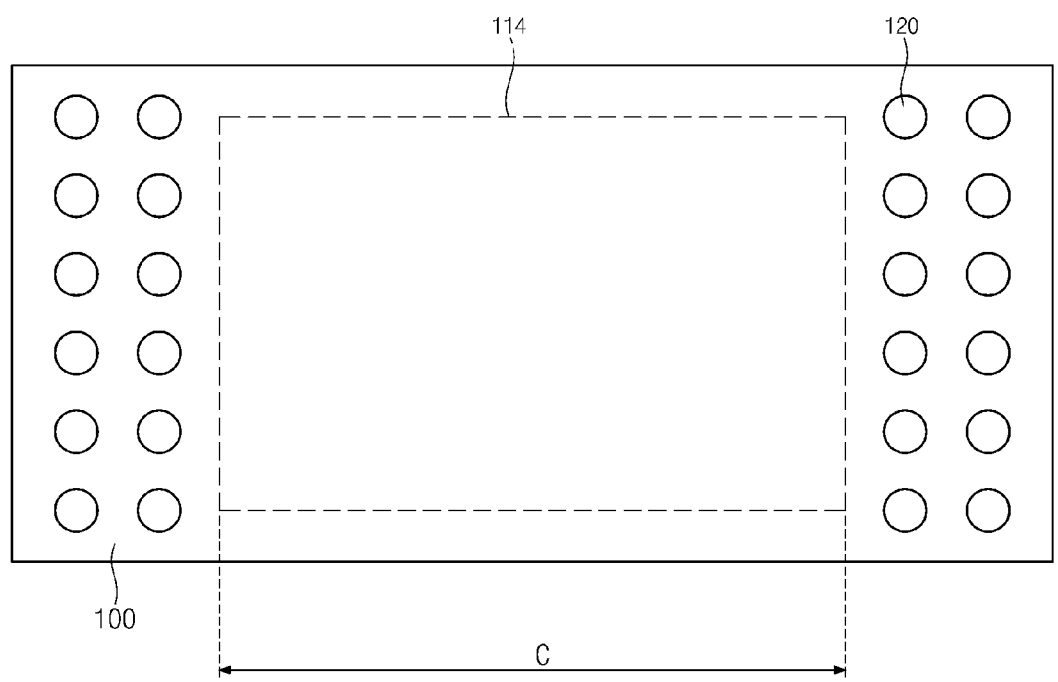
FIG. 1C is a bottom view illustrating a bottom of FIG. 1A, according to an exemplary embodiment.
Figure 1D:
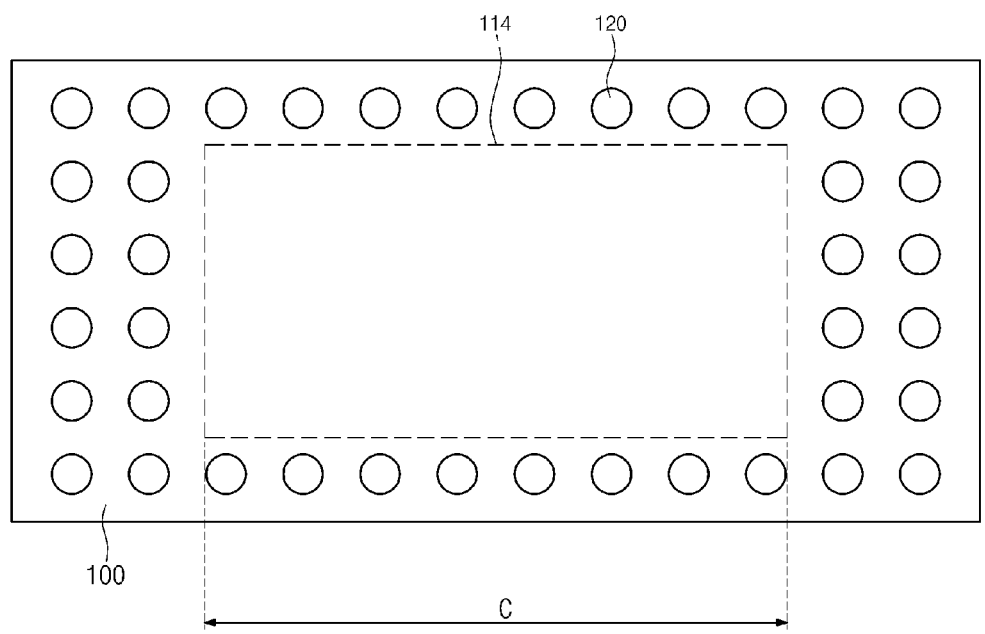
FIG. 1D is a bottom view illustrating a bottom of FIG. 1A, according to another exemplary embodiment.

FIG. 1A is a cross-sectional view illustrating a semiconductor package according to an exemplary embodiment. FIG. 1B is an enlarged view of a portion A of the semiconductor package in FIG. 1A, according to an exemplary embodiment. FIG. 1C is a bottom view illustrating a bottom of FIG. 1A, according to an exemplary embodiment. FIG. 1D is a bottom view illustrating a bottom of FIG. 1A, according to another exemplary embodiment.

Referring to FIGS. 1A to 1C, a semiconductor device, such as semiconductor package 10 according to one embodiment may include a substrate 100, a plurality of semiconductor chips 114, and a plurality of connection terminals 120.

The substrate 100 may be, for example, a Printed Circuit Board (PCB) for supporting and electrically connecting to a stack of semiconductor chips, and may serve as a package substrate.

According to certain embodiments, the substrate 100 may include a center portion C and an edge portion E. In one embodiment, when the semiconductor package 10 is viewed as a cross-section, center portion C is between a first and second edge sub-portions E, such that an inner portion of the substrate 100 is surrounded on both sides by edge portion E. In one embodiment, substrate 100 includes a first recess 106 in center portion C, and one or more second recesses 108 in edge portion E. In the first recess 106, a portion of a top of the substrate 100 (e.g., a first surface portion of the substrate 100 on which the semiconductor chips 114 are disposed) is removed, and in the second recesses 108, a portion of a bottom of the substrate (e.g., a second surface portion of the substrate 100 that connects to an external device) is removed. The first recess 106 may have a concave shape recessed from the top of the substrate 100 toward the bottom thereof, and each of the second recesses 108 may have a concave shape recessed from the bottom of the substrate 100 toward the top thereof.

In one embodiment, the width of the first recess 106 may have a size enabling the accommodation of stacked semiconductor chips 114. In addition, the width of the each second recess 108 may have a size enabling the accommodation of a corresponding connection terminal. In one embodiment, the width of the each second recess 108 may be substantially less than that of the first recess 106. For example, a second width of each of the second recesses may be sufficient to surround a terminal such as a solder ball, while a first width of the first recess may be sufficient to surround a semiconductor chip, such that the first width is greater than the second width by a factor of 5, 10, 20 or more.

In one embodiment, the substrate 100 may include a core 102, and a prepreg 104. For example, the substrate 100 may have a structure in which the core 102 and the prepreg 104 are alternately stacked, such that, for example, the core 102 is between two prepeg portions, one above the core and one below. The core 102 may include, for example, a fiberglass-epoxy resin. The prepreg 104 may include, for example, a fiberglass-epoxy resin, a Composite Electro Material (CEM), polymide, or teflon.

First pads 110 and a second pad 111 may be disposed in a top portion of the edge portion E of the substrate 100. First pads 110 and second pad 111 may be, for example, connection pads that include conductive material for electrically connecting circuit elements within semiconductor device 10. According to one embodiment, a first (e.g., top) surface of the first pad 110 may be covered by the prepreg 104, and a second, opposite (e.g., bottom) surface of the first pad 110 may be exposed by the second recess 108. In addition, a first (e.g., top) surface of the second pad 111 may be exposed outside the substrate 100, and a second, opposite (e.g., bottom) surface of the second pad 111 may be buried in and covered by the prepreg 104.

In one embodiment, a third pad 112 may be disposed in the center portion C of the substrate 100. The third pad 112 may be, for example, a mounting pad for mounting semiconductor chips 114 on substrate 100. The third pad 112 may have an area greater than the size of each of the semiconductor chips 114 in order to mount and support the semiconductor chips 114. As a non-limiting example, depending on the manner in which chips are stacked, the area can be between 1.1 and 2.5 times the area of each of the chips.

In one embodiment, both ends of the third pad 112 may be inserted into the substrate 100. More specifically, a first surface (e.g., a top surface) on both ends of the third pad 112 may contact the core 102, and a second, opposite surface (e.g., a bottom surface) on both ends of the third pad 112 may contact the prepreg 104.

In one embodiment, the first surface of the third pad 112 may be exposed outside the substrate 100 by the first recess 106. The second surface of the third pad 112 may be buried in and covered by the prepreg 104. According to certain embodiments, the second (e.g., bottom) surface of the first pad 110 and the second (e.g., bottom) surface of the second pad 111 may be disposed higher than the first (e.g., top) surface of the third pad 112. For example, in one embodiment, the distance between a bottom surface of either the first pad 110 or the second pads 111 and a top surface of the third pad may be equal to or greater than a thickness of the core 102.

The semiconductor chips 114 may be mounted at the first recess 106. For example, a bottom chip of the semiconductor chips 114 may be in the first recess 106 between side edges of the recess. In one embodiment, a bottom chip closest to the bottom surface of the first recess 106 of the substrate 100 may have a thickness smaller than the depth of the recess. However, other arrangements and depths and thicknesses are possible. The remaining chips of the stack may be horizontally between side edges of the first recess 106, but such a configuration is only one example.

The semiconductor chips 114 may be stacked in a vertical direction. A chip pad 115 electrically connected to the second pad 111 may be formed on each of the semiconductor chips 114 (though not shown, multiple chip pads 115 for each chip may be electrically connected to multiple corresponding second pads 111 on substrate 100). In one embodiment, the semiconductor chips 114 may be stacked in order for the chip pad 115, which is formed on the each semiconductor chip 114, to be exposed to the outside of the chip. The chip pads 115 may be electrically connected, for example, to the second pads 111 through a bonding wires 116.

For example, when sixteen semiconductor chips 114 are stacked, they can be divided into first to fourth groups, i.e., four semiconductor chips 114 configure one group. When the four semiconductor chips 114 of the first group are stacked one by one from the lowermost layer to an upper layer, the semiconductor chips 114 may be stacked while being moved to one side so as to expose the chip pads 115 that are respectively disposed on edge portions of the four semiconductor chips 114, and so the four semiconductor chips 114 are stacked in a stepwise manner. The four semiconductor chips 114 of the second group may be stacked on the four semiconductor chips 114 of the first group. The four semiconductor chips 114 of the second group may be sequentially stacked while being moved to the other side. As such, chips may be stacked in a zig zag pattern on the first recessed portion of the substrate 100. Though an example where each single-direction portion of the zig zag pattern includes four semiconductor chips 114, such a configuration is only one example. In other embodiments, one chip, or two, three, or some other number of chips may comprise each single-direction portion of the zig zag pattern.

In addition, in certain embodiments, rather than using chip stacks that employ wire bonding, chip stacks that use through vias (either through all of the semiconductor chips 114 or through groups of the semiconductor chips 114 and/or portions of the semiconductor chips 114), such as through-silicon vias, may be used. In such a case, and/or in cases where fewer than four semiconductor chips 114 are used for each single-direction portion of a zig zag pattern, the width of the overall chip stack can be made smaller, and the width of the overall semiconductor package 10 can be made smaller. In addition, other patterns other than zig zag patterns can be used in the chip stack, such as a straight aligned stack (when viewed in the cross-sectional manner shown in FIG. 1) particularly in the case where through vias are used, or a spiral shape or ziggurat shape using different sized chips and having two, three, or more levels. Additional exemplary configurations of chip stacks are described in U.S. Patent Application Publication No. 2010-0117217, published on May 13, 2010, which is incorporated herein by reference in its entirety.

The semiconductor chips 114 can be memory chips, logic chips, master chips, slave chips, different combinations thereof, or other chips configured to be part of a semiconductor package.

The connection terminals 120 may be disposed in the second recesses 108. The bottom surfaces of the first pads 110 may face and thus be exposed by the second recesses 108, respectively. The exposed bottom surfaces of the first pads 110 and the connection terminals 120 may contact each other to form an electrical connection. According to one embodiment, each of the connection terminals 120 may be a solder ball that forms part of a BGA. As shown in FIG. 1A, in one embodiment, the bottom surface of the first recess 106 may be at a lower height within the semiconductor package 10 than the bottom surfaces of the first pads 110 (e.g., the bottom surface of the first recess 106 may be closer to the bottom surface of the substrate 100 than the bottom surface of the first pads 110 are to the to the bottom surface of the substrate 100).

When the semiconductor chips 114 are mounted on the center portion C of the substrate 100, the connection terminals 120 may be disposed in the outer, edge portion E of the substrate 100, respectively. Referring to FIG. 1C, the connection terminals 120 may be aligned and arranged at both sides of a center portion of the substrate 110, thus surrounding those two sides of the center portion of the substrate 110. Referring to FIG. 1D, the connection terminals 120 maybe aligned and arranged at the same two sides, and also at upper sides and lower sides of the center portion of the substrate 110, and may therefore entirely surround the center portion of the substrate 110 when viewed from a top-down view.

Because the semiconductor chips 114 are mounted in the first recess 106, the total height of the semiconductor package 10 can decrease by the concave height (i.e., the depth) of the first recess 106. Moreover, when the connection terminals 120 are disposed in the second recesses 108, the total height of the semiconductor package 10 can decrease additionally by the concave heights (i.e., the depths) of the second recesses 108. Accordingly, the total height of the semiconductor package 10 can be considerably reduced by the first recess 106 and the second recesses 108.

In one embodiment, for example, substrate 100 may have a thickness T, first recess 106 may have a depth of D1, and second recesses 108 may have depths of D2. D1 may be, for example, greater than ½ of T, or even ⅔ or a higher percentage of T, and may be greater than a thickness of each of or any one of the semiconductor chips 114. D2 may be, for example, greater than ½ of T or even ⅔ or a higher percentage of T, and may be approximately the same depth as a vertical height of connection terminals 120 but slightly smaller to leave enough of the connection terminals 120 disposed below a bottom surface of the substrate 110 to provide for an external connection. In a case where D1+D2 is greater than T (for example, in a case where both D1 and D2 extend into the substrate to a depth past a mid-point of the thickness T), the height of the semiconductor package 10 may be reduced by an amount greater than the thickness T of the substrate. As such, the height from a bottom surface of the package substrate to a top surface of an upper-most semiconductor chip of the stack in the semiconductor package 10 can be made less than a combined height of the stack of semiconductor chips and the plurality of connection terminals 120 taken separately. Because the first recess 106 is at a top portion of the substrate 100 and the second recess 108 is at a bottom portion of the substrate 100, and the recesses are disposed at different lateral portions of the substrate 100, such overall height space savings are possible.

In one embodiment, a molding material 118 may cover the semiconductor chips 114 and be formed. The molding material 118 may be formed, for example, of an epoxy resin.

(Method of Manufacturing Semiconductor Package)

FIGS. 2A to 2E are cross-sectional views illustrating a method of manufacturing a semiconductor package according to an exemplary embodiment.

Figure 2A:
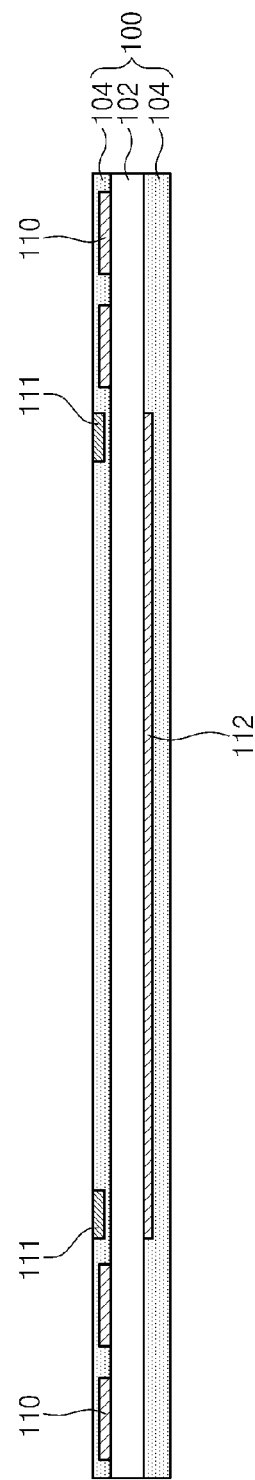

Referring to FIG. 2A, a substrate 100 may be prepared on which a plurality of first pads 110, a second pad 111 and a third pad 112 are formed. In one embodiment, the pads may be the same as those shown in FIG. 1A.

For example, the first and third pads 110 and 112 may be formed in a core 102. The first pads 110 may be formed on a first surface (e.g., top surface) on an edge portion E of the core 102. The third pad 112 may be formed on the a second, opposite surface (e.g., bottom surface) on a center portion C of the core 102. A prepreg 104 covering the first and third pads 110 and 112 may be formed on both surfaces of the core 102. In one embodiment, the second pad 111 may be formed by partially etching the prepreg 104 adjacent to the first pads 110 and burying a conductive material. However, the method of forming the first through third pads 110-112 is not limited to the method described above.

Figure 2B:
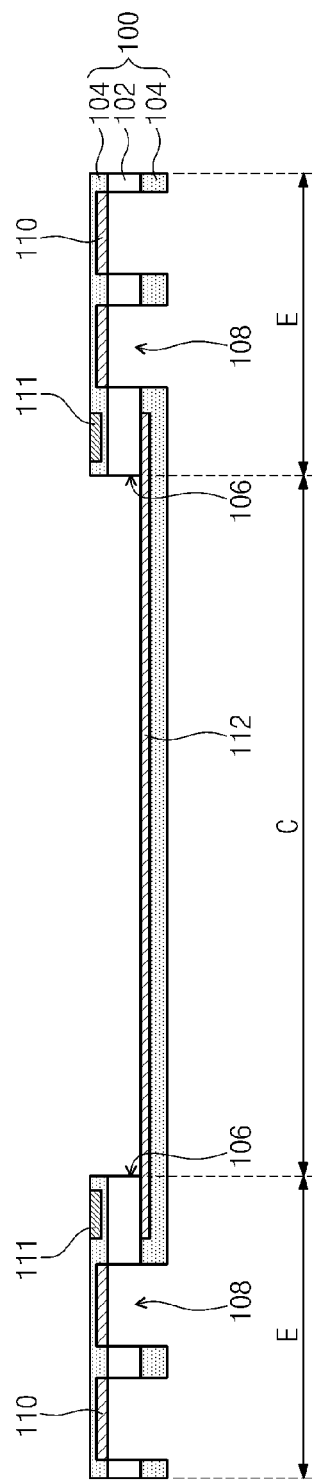

Referring to FIG. 2B, a first recess 106 and a plurality of second recesses 108 may be formed on the substrate 100.

By removing the center portion C of the top of the substrate 100, the first recess 106 exposing a first surface (e.g., top surface) of the third pad 112 may be formed. By removing part of the edge portion E of the bottom of the substrate 100, the second recesses 108 exposing second surfaces (e.g., bottom surfaces) of the first pads 108 may be formed. The first recess 106 and the second recesses 108 may be easily formed by removing the substrate 100, for example, with a laser or a drill.

In one embodiment, after the first recess 106 is formed, the normal function of a PCB may be still achieved around the first recess 106. Therefore, even when the first recess 106 is formed, the substrate 100 may support the semiconductor chips 114 and be electrically interconnected to the semiconductor chips 114.

Figure 2C:
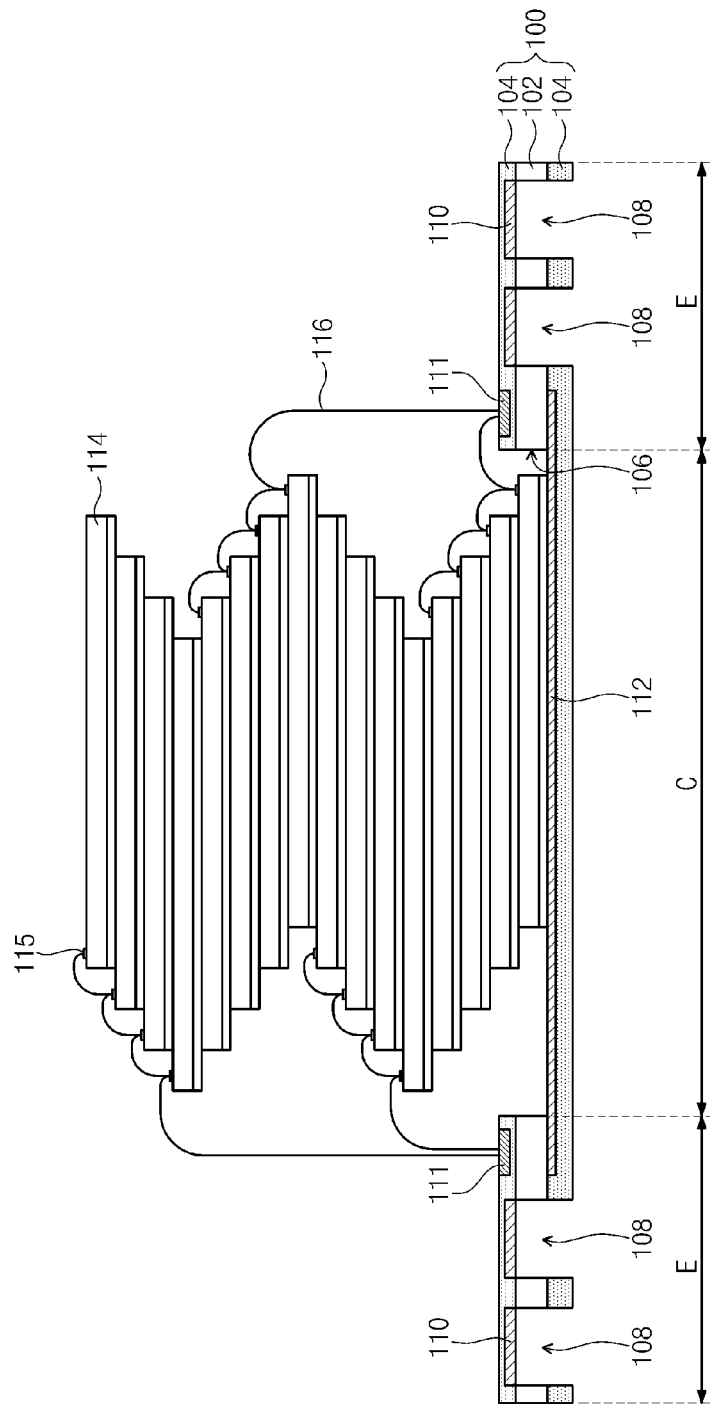

Referring to FIG. 2C, multi-layer semiconductor chips 114 may be mounted in the first recess 106, for example, in the form of a chip stack.

Each of the semiconductor chips 114 may include a chip pad 115 (or multiple chip pads extending along the direction not shown in the cross-sectional FIG. 2C). The semiconductor chips 114 may be stacked in a vertical direction for the chip pads 115 to be exposed to the outside. The chip pads of the stacked semiconductor chips 114 may be electrically connected to corresponding second pads 111 through the bonding wires 116, respectively. In an alternative embodiment (not shown), one or more through vias can be used to electrically connect chips to each other and/or to the substrate 100.

Referring to FIG. 2D, a molding material 118 covering the substrate 100 and the semiconductor chips 114 may be formed on the substrate 100. The molding material 118 may be formed, for example, of an epoxy resin.

Figure 2E:
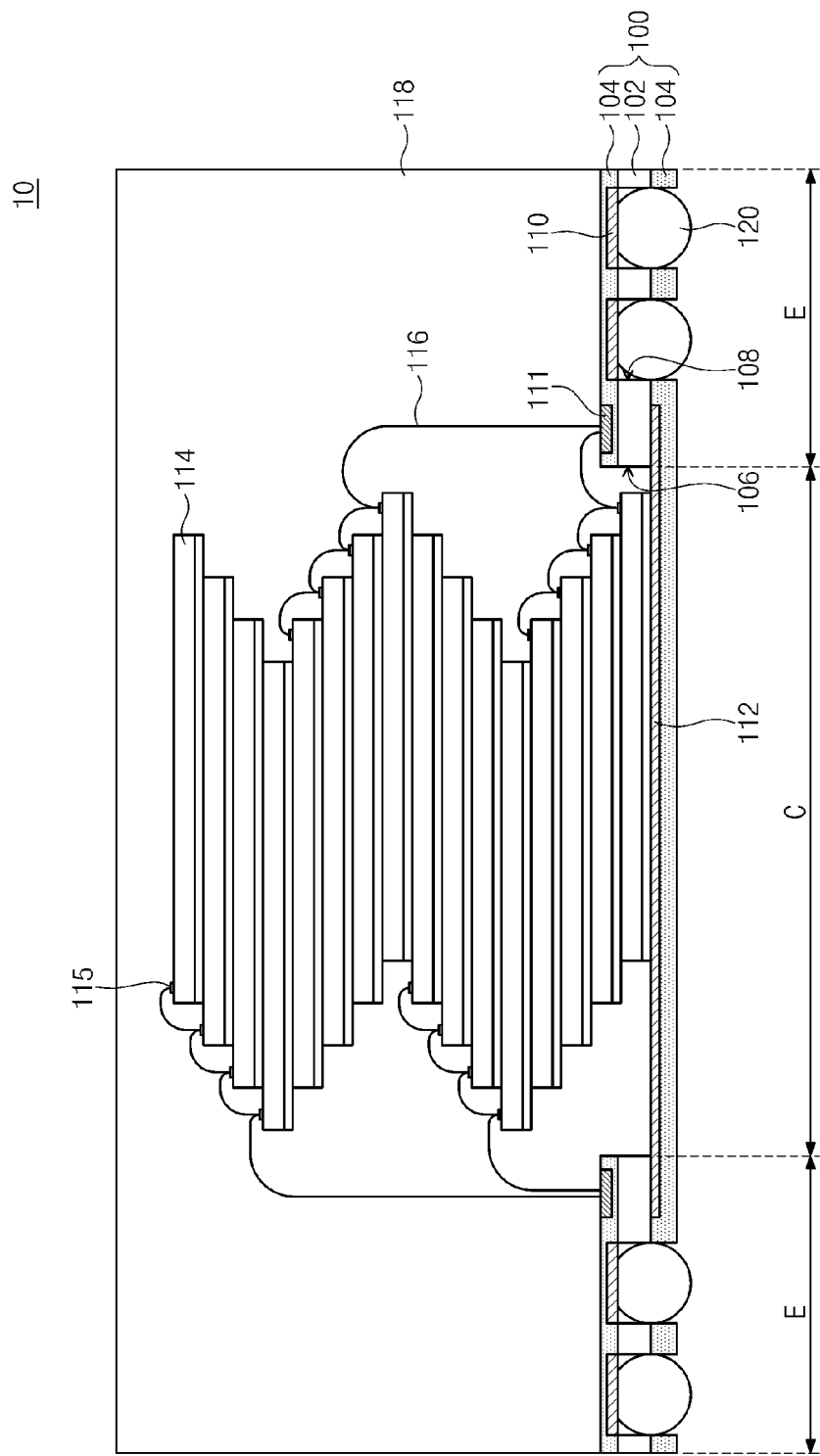

Referring to FIG. 2E, connection terminals 120 may be disposed in the second recesses 108, and thus they may be electrically connected to the first pads 110 and exposed to the outside of the semiconductor package 10 to connect to external devices.

The bottom surfaces of the first pads 110 may be exposed by the second recesses 108. The connection terminals 120 may be disposed in the second recesses 108 and contact the bottom surfaces of the first pads 110. According to one embodiment, each of the connection patterns 120 may be a solder ball.

The semiconductor chips 114 are mounted in the first recess 106, and thus the total height of the semiconductor package 10 can decrease by the concave height of the first recess 106. Moreover, the connection terminals 120 are disposed in the second recesses 108, and thus the total height of the semiconductor package 10 can additionally decrease by the concave heights of the second recesses 108. Accordingly, the total height of the semiconductor package 10 can be considerably reduced by the first recess 106 and the second recesses 108.

(Package on Package)

Figure 3:
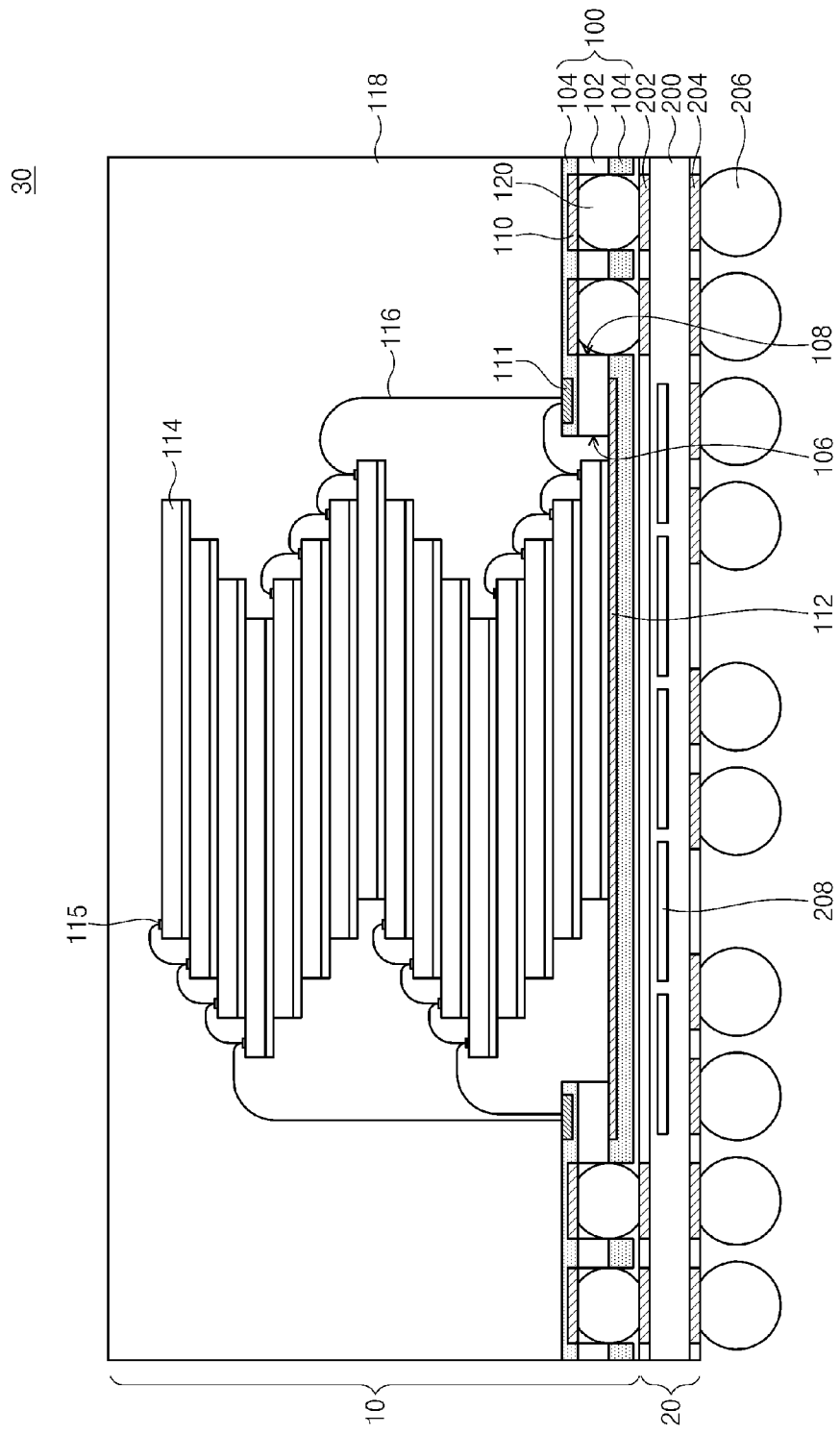
FIG. 3 is a cross-sectional view illustrating a package on package device according to an exemplary embodiment.

FIG. 3 is a cross-sectional view illustrating a package on package semiconductor device according to an exemplary embodiment.

Referring to FIG. 3, in one embodiment, a package on package semiconductor device 30 may include a first semiconductor package 10 and a second semiconductor package 20.

The first semiconductor package 10 may include, for example, a first substrate 100, and a plurality of first semiconductor chips 114. The second semiconductor package 20 may include a second substrate 100, and a plurality of second semiconductor chips 208. The first and second semiconductor packages 10 and 20 may be stacked in a vertical direction. The first and second semiconductor packages 10 and 20 may be electrically connected to the connection terminals 120.

The first semiconductor package 10 and connection terminals 120 according to one embodiment may be the same as the semiconductor package described above with reference to FIGS. 1A and 1B, and thus its detailed description will be omitted.

In one embodiment, the second substrate 200 may be a PCB. The second substrate 200 may be separated by a certain distance from the first substrate 100 and be disposed under the first substrate 100. Fourth pads 202 electrically connected to the connection terminals 120 may be formed in a first surface (e.g., a top surface) of the second substrate 200 facing the first substrate 100. The fourth pads 202 may be disposed at a position laterally corresponding to the first pads 110 of the first semiconductor package 10.

An external terminal 206 may be electrically connected to a second surface (e.g., a bottom surface) of the second substrate 200. The external terminal 206 may be electrically connected to a fifth pad 204 that is formed in the second surface of the second substrate 200. For example, in one embodiment, the external terminal 206 may be a solder ball.

Second semiconductor chips 208 may be mounted in the second substrate 200. However, the location and arrangement of the second semiconductor chips shown in FIG. 3 is exemplary only, and the mounted position of the second semiconductor chips 208 is not limited thereto.

The semiconductor chips 114 are mounted in the first recess 106 of the semiconductor package 10, and thus the total height of the package on package semiconductor device 30 can decrease by the concave height of the first recess 106. Moreover, the connection terminals 120 are disposed in the second recesses 108, and thus the total height of the package on package 30 can additionally decrease by the concave heights of the second recesses 108.

Application Example

Figure 4A:
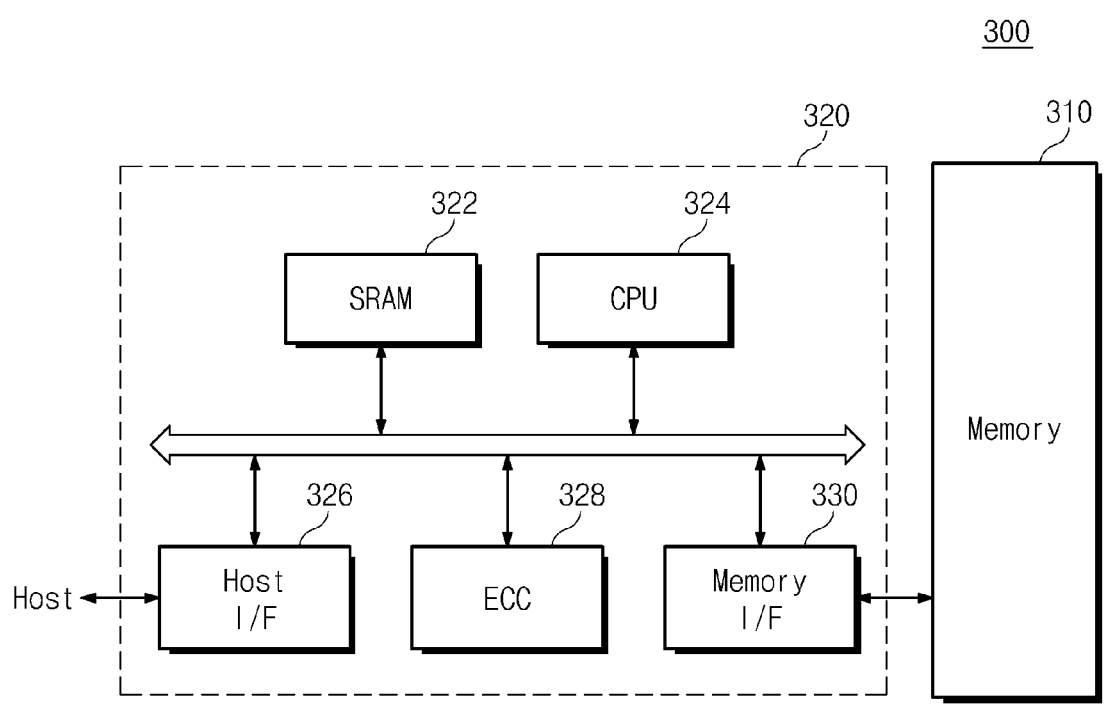
FIG. 4A is a block diagram illustrating a memory card which includes a memory device, according to an exemplary embodiment.

FIG. 4A is a block diagram illustrating a memory card that includes a memory device, according to an exemplary embodiment.

Referring to FIG. 4A, a memory device according to one embodiment may be applied to a memory card 300. As an example, the memory card 300 may include a memory controller 320 that allows data exchange between a host and a memory 310. A Static Random Access Memory (SRAM) 322 may be used as a working memory of a Central Processing Unit (CPU) 324. A host interface 326 may include a data exchange protocol of the host that is connected to the memory card 300. An Error Correction Code (ECC) block 328 may detect and correct the error of data that is read from the memory 310. A memory interface 330 interfaces with the memory 310. The CPU 324 performs an overall control operation for data exchange of the memory controller 320. Memory 310 can be one of many types of memories, such as, for example, a resistive memory such as RRAM, a NAND flash memory, PRAM, EEPROM, etc.

In one embodiment, the memory 310 applied to the memory card 300 includes the semiconductor package according to embodiments described herein, and can considerably reduce the total height of the semiconductor package by the concave height of first recess and the concave heights of the second recesses. Accordingly, the number or unique function of the semiconductor chips in the semiconductor package is maintained, and the height of semiconductor package can decrease. As an alternative, some or all of the functions performed by the memory controller 320 can be performed by one of the chips in the chip stack described in connection with FIGS. 1-3 above.

Figure 4B:
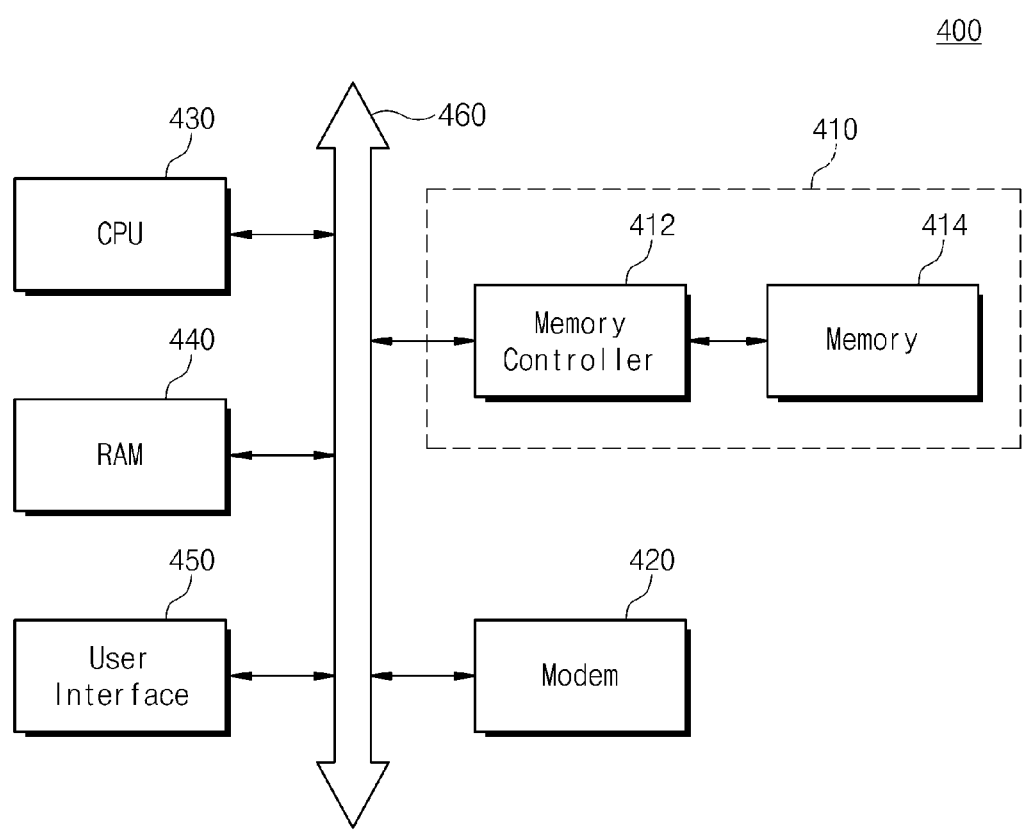
FIG. 4B is a block diagram illustrating an information processing system which applies a memory device, according to an exemplary embodiment.

FIG. 4B is a block diagram illustrating an information processing system which applies a memory device, according to an exemplary embodiment.

Referring to FIG. 4B, an information processing system 400 may include a semiconductor memory device according to one embodiment, for example, a memory system 410 including a resistance variable memory or other type of memory. The information processing system 400 may include a mobile device, such as a cell phone, PDA, personal media player, laptop, or the like, or a desktop computer. As an example, the information processing system 400 may include a modem 420 or other communication interface, a CPU 430, a Random Access Memory (RAM) 440 and a user interface 450 that are electrically connected to the memory system 410 through the system bus 460. The memory system 410 may store data that are processed by the CPU 430 or external data. The memory system 410 may include a memory 412 and a memory controller 414, and may be configured, in one embodiment, in the same way as the memory card 300 described above with reference to FIG. 4A. The information processing system 400 may be provided as a memory card, a Solid State Disk (SSD), a camera image processor, or other application chipset. For example, the memory system 410 may be configured as the SSD. In this case, the information processing system 400 may stably and reliably store large-scale data in the memory system 410.

According to embodiments described herein, a semiconductor chip stack may be mounted in a first recess of a substrate, and thus the total height of a semiconductor package including the chip stack can decrease by the concave height of the first recess. Moreover, connection terminals may be disposed in second recesses of the substrate, and thus the total height of the semiconductor package can additionally decrease by the concave heights of the second recesses. Accordingly, the total height of the semiconductor package can be considerably reduced by the first recess and the second recesses, in some cases by a height greater than the thickness of the substrate.

The above-disclosed subject matter is to be considered illustrative and not restrictive, and the appended claims are intended to cover all such modifications, enhancements, and other embodiments, which fall within the true spirit and scope of the inventive concept. Thus, the scope is to be determined by the broadest permissible interpretation of the following claims and their equivalents, and shall not be restricted or limited by the foregoing detailed description.

What is claimed is:

1. A semiconductor package comprising:
a package substrate including:
 a center portion that has a first recess having a concave shape such that a top surface of the package substrate outside of the recess is higher than a top surface of the package substrate in the recess, and
 an edge portion which has a plurality of second recesses having concave shapes such that for each second recess, a bottom surface of the package substrate outside of the recess is lower than a bottom surface of the package substrate in the recess,
a plurality of semiconductor chips mounted in the first recess; and
a plurality of connection terminals respectively disposed in the second recesses; and
a plurality of first pads at a top portion of the package substrate in the edge portion of the package substrate,
wherein bottom surfaces of the first pads are exposed by the second recesses.

2. The semiconductor package of claim 1, wherein the plurality of semiconductor chips comprise a stack of semiconductor chips.

3. The semiconductor package of claim 2, wherein the stack of semiconductor chips extends from the top surface of the package substrate in the recess past the top surface of the package substrate outside of the recess.

4. The semiconductor package of claim 1, wherein:
each of the semiconductor chips includes a chip pad, and
the chip pads are electrically connected to pads at a top surface of the package substrate.

5. The semiconductor package of claim 1, further comprising a molding material covering the semiconductor chips on the package substrate.

6. The semiconductor package of claim 1, wherein:
a depth of the first recess is greater than a thickness of each of the semiconductor chips,
a depth of each of the second recesses is approximately the same as a vertical height of each of the connection terminals, and
a width of the first recess is substantially greater than a width of the each second recess.

7. The semiconductor package of claim 1, wherein:
as a result of the first recess and second recess, a height of the semiconductor package is less than what the height of the semiconductor package would be if the package substrate did not include the recesses, and the difference between those heights is an amount equal to or greater than the thickness of the package substrate.

8. The semiconductor package of claim 1, wherein:
the edge portion is on two opposite sides of the center portion.

9. The semiconductor package of claim 8, wherein:
the edge portion is an outer region surrounding the entire center portion.

10. The semiconductor package of claim 1, wherein:
the semiconductor package is a package-on-package device; and
the package substrate, plurality of semiconductor chips, and plurality of connection terminals are part of a first semiconductor package of the package-on-package device, and further comprising:
a second semiconductor package of the package-on-package device, the second semiconductor package including a package substrate and one or more semiconductor chips mounted thereon,
wherein the connection terminals of the first semiconductor package are electrically connected to the second semiconductor package.

11. The semiconductor package of claim 1, wherein:
the first recess extends more than half of the distance into the package substrate from the top surface of the package substrate outside of the recess, and
each of the plurality of second recesses extends more than half of the distance into the package substrate from the bottom surface of the package substrate outside of the respective second recess.

12. The semiconductor package of claim 1, wherein:
the package substrate includes at least two layers; and
side surfaces of the first recess are formed by side surfaces of the at least two layers, the side surfaces of the layers of the at least two layers being coplanar with each other.

13. A stacked semiconductor chip package, comprising:
a package substrate including a first recess having a first depth and a plurality of second recesses each having a second depth, wherein the first recess is disposed at a first surface of the package substrate and has a concave shape recessed from the first surface of the package substrate, and the second recess is disposed at a second, opposite surface of the package substrate and has a concave shape recessed from the second surface of the package substrate;
a semiconductor chip stack disposed at the first recess and including a plurality of semiconductor chips; and
a plurality of connection terminals disposed in respective ones of the plurality of second recesses,
wherein the first recess extends more than half of the distance into the package substrate from the first surface of the package substrate, and
the plurality of second recesses extend more than half of the distance into the package substrate from the second surface of the package substrate.

14. The semiconductor substrate of claim 13, wherein each connection terminal extends from within the respective second recess past the second surface of the package substrate.

15. The semiconductor substrate of claim 13, further comprising:
a plurality of first pads disposed within the respective plurality of second recesses and connected to the respective plurality of connection terminals; and
at least a second pad disposed at the first surface of the package substrate and electrically connected to at least one of the semiconductor chips.

* * * * *